(12) United States Patent
Bae et al.

(10) Patent No.: US 9,673,057 B2
(45) Date of Patent: Jun. 6, 2017

(54) METHOD FOR FORMING STAIR-STEP STRUCTURES

(71) Applicant: Lam Research Corporation, Fremont, CA (US)

(72) Inventors: In Deog Bae, San Ramon, CA (US); Qian Fu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 38 days.

(21) Appl. No.: 14/665,815

(22) Filed: Mar. 23, 2015

(65) Prior Publication Data

US 2016/0284555 A1    Sep. 29, 2016

(51) Int. Cl.

| | | |
|---|---|---|
| *H01L 21/311* | (2006.01) | |
| *H01L 21/302* | (2006.01) | |
| *H01L 21/461* | (2006.01) | |
| *B44C 1/22* | (2006.01) | |
| *C03C 15/00* | (2006.01) | |
| *C03C 25/68* | (2006.01) | |
| *C03C 1/00* | (2006.01) | |
| *H01L 39/24* | (2006.01) | |
| *H01L 21/3065* | (2006.01) | |
| *H01L 21/306* | (2006.01) | |
| *H01L 27/11556* | (2017.01) | |

(Continued)

(52) U.S. Cl.
CPC .. *H01L 21/31116* (2013.01); *H01L 21/30604* (2013.01); *H01L 21/30655* (2013.01); *H01L 21/31138* (2013.01); *H01L 21/31144* (2013.01); *H01L 39/247* (2013.01); *H01L 21/31055* (2013.01); *H01L 27/11548* (2013.01); *H01L 27/11556* (2013.01); *H01L 27/11573* (2013.01); *H01L 27/11582* (2013.01); *H01L 2224/11916* (2013.01)

(58) Field of Classification Search
None
See application file for complete search history.

(56) References Cited

U.S. PATENT DOCUMENTS

| 5,532,089 A | 7/1996 | Adair et al. |
|---|---|---|
| 5,738,757 A | 4/1998 | Burns et al. |

(Continued)

FOREIGN PATENT DOCUMENTS

| JP | 2000-91308 | 3/2000 |
|---|---|---|
| KR | 10-2014-0001948 | 1/2014 |

(Continued)

OTHER PUBLICATIONS

International Search Report dated Apr. 2, 2012 from International Application No. PCT/US11/61965.

(Continued)

*Primary Examiner* — Stephanie Duclair
(74) *Attorney, Agent, or Firm* — Beyer Law Group LLP

(57) ABSTRACT

A method for forming a stair-step structure in a substrate within a plasma processing chamber is provided. An organic mask is formed over the substrate. The organic mask is trimmed with a vertical to lateral ratio of less than 0.8, wherein the trimming simultaneously forms a deposition over the organic mask. The substrate is etched. The steps of trimming the organic mask and etching the substrate are cyclically repeated a plurality of times.

14 Claims, 8 Drawing Sheets

(51) Int. Cl.
H01L 27/11582 (2017.01)
H01L 21/3105 (2006.01)
H01L 27/11548 (2017.01)
H01L 27/11573 (2017.01)

(56) References Cited

U.S. PATENT DOCUMENTS

| | | | |
|---|---|---|---|
| 5,773,368 | A | 6/1998 | Moran |
| 6,043,119 | A | 3/2000 | Wu et al. |
| 6,159,823 | A | 12/2000 | Song et al. |
| 6,239,035 | B1 | 5/2001 | Harris |
| 6,417,108 | B1 | 7/2002 | Akino et al. |
| 6,727,158 | B2 | 4/2004 | Sundt et al. |
| 6,833,327 | B2 | 12/2004 | Ishikawa |
| 7,396,711 | B2 | 7/2008 | Shah et al. |
| 7,786,020 | B1 | 8/2010 | Kang et al. |
| 8,242,024 | B2 | 8/2012 | Chen |
| 8,263,496 | B1* | 9/2012 | Wodecki ......... H01L 21/31116 216/22 |
| 8,492,824 | B2 | 7/2013 | Yahashi |
| 8,530,350 | B2 | 9/2013 | Freeman et al. |
| 8,535,549 | B2 | 9/2013 | Fu et al. |
| 8,564,050 | B2 | 10/2013 | Park et al. |
| 8,569,182 | B2 | 10/2013 | Park et al. |
| 8,704,288 | B2 | 4/2014 | Lee et al. |
| 8,907,707 | B2 | 12/2014 | Cooke |
| 9,048,193 | B2 | 6/2015 | Oh et al. |
| 2002/0052098 | A1 | 5/2002 | Chang et al. |
| 2002/0166838 | A1 | 11/2002 | Nagarajan |
| 2005/0045951 | A1 | 3/2005 | Yamada et al. |
| 2005/0095741 | A1 | 5/2005 | Johnstone et al. |
| 2005/0255668 | A1 | 11/2005 | Tseng et al. |
| 2006/0019443 | A1 | 1/2006 | Kim et al. |
| 2007/0023916 | A1 | 1/2006 | Kim et al. |
| 2007/0065966 | A1 | 3/2007 | Chinthakindi et al. |
| 2007/0252201 | A1 | 11/2007 | Kito et al. |
| 2008/0050919 | A1 | 2/2008 | Aelst et al. |
| 2008/0073635 | A1 | 3/2008 | Kiyotoshi et al. |
| 2008/0197109 | A1 | 8/2008 | Mui et al. |
| 2008/0265311 | A1 | 10/2008 | Tang et al. |
| 2009/0310415 | A1 | 12/2009 | Jin et al. |
| 2010/0117143 | A1 | 5/2010 | Lee et al. |
| 2010/0133599 | A1 | 6/2010 | Chae |
| 2010/0173498 | A1 | 7/2010 | Abatchev et al. |
| 2010/0176440 | A1 | 7/2010 | Omura |
| 2010/0178771 | A1 | 7/2010 | Oh et al. |
| 2010/0213526 | A1 | 8/2010 | Wada et al. |
| 2010/0248457 | A1 | 9/2010 | Shin et al. |
| 2010/0323505 | A1 | 12/2010 | Ishikawa et al. |
| 2011/0031630 | A1 | 2/2011 | Hashimoto |
| 2011/0092038 | A1 | 4/2011 | Choi et al. |
| 2011/0108907 | A1 | 5/2011 | Maeda |
| 2011/0163420 | A1 | 7/2011 | Valdivia et al. |
| 2011/0169067 | A1 | 7/2011 | Ernst et al. |
| 2011/0201167 | A1 | 8/2011 | Satonaka et al. |
| 2011/0204421 | A1 | 8/2011 | Choi et al. |
| 2011/0284946 | A1 | 11/2011 | Kiyotoshi |
| 2012/0003831 | A1 | 1/2012 | Kang et al. |
| 2012/0119287 | A1 | 5/2012 | Park et al. |
| 2012/0149201 | A1 | 6/2012 | Fu et al. |
| 2012/0149203 | A1 | 6/2012 | Fu et al. |
| 2012/0171861 | A1 | 7/2012 | Park et al. |
| 2012/0187471 | A1 | 7/2012 | Yu et al. |
| 2012/0225561 | A1* | 9/2012 | Watanabe ......... H01J 37/32091 438/710 |
| 2012/0306089 | A1 | 12/2012 | Freeman et al. |
| 2012/0319173 | A1 | 12/2012 | Ko et al. |
| 2013/0056818 | A1 | 3/2013 | Iino et al. |
| 2013/0062683 | A1 | 3/2013 | Fukuzumi et al. |
| 2013/0161821 | A1 | 6/2013 | Hwang et al. |
| 2013/0234232 | A1 | 9/2013 | Yahashi |
| 2014/0054789 | A1 | 2/2014 | Chiu et al. |

FOREIGN PATENT DOCUMENTS

| | | |
|---|---|---|
| TW | 200402087 | 2/2004 |
| TW | 201005954 | 2/2010 |

OTHER PUBLICATIONS

Written Opinion dated Apr. 2, 2012 from International Application No. PCT/US11/61965.
Notice of Allowance dated Sep. 26, 2012 from U.S. Appl. No. 12/968,210.
Office Action dated Sep. 24, 2014 from U.S. Appl. No. 13/668,939.
Notification of Examination Opinions date Nov. 20, 2015 from Taiwan Patent Application No. 100146204.
Office Action dated May 21, 2015 from U.S. Appl. No. 14/581,673.
Notice of Allowance dated Dec. 18, 2015 from U.S. Appl. No. 14/581,673.

\* cited by examiner

_US 9,673,057 B2_

METHOD FOR FORMING STAIR-STEP STRUCTURES

BACKGROUND OF THE INVENTION

The present invention relates to the formation of semiconductor devices. More specifically, the invention relates to the formation of stair-step semiconductor devices.

During semiconductor wafer processing, stair-step features are sometimes required. For example, in 3D flash memory devices, multiple cells are stacked up together in chain format to save space and increase packing density. The stair-step structure allows electrical contact with every gate layer.

U.S. Pat. No. 8,535,549, by Fu et al. issued on Sep. 17, 2013, which is incorporated by reference for all purposes, discloses the deposition of a hardmask over an organic mask in forming a stair-step structure.

SUMMARY OF THE INVENTION

To achieve the foregoing and in accordance with the purpose of the present invention, a method for forming a stair-step structure in a substrate within a plasma processing chamber is provided. An organic mask is formed over the substrate. The organic mask is trimmed with a vertical to lateral ratio of less than 0.8, wherein the trimming simultaneously forms a deposition over the organic mask. The substrate is etched. The steps of trimming the organic mask and etching the substrate are cyclically repeated a plurality of times.

In another manifestation of the invention, a method for making a three dimensional memory structure is provided. A memory stack is provided comprising a plurality of layers, wherein each layer comprises at least two sublayers. An organic mask is formed over the memory stack. The organic mask is trimmed with a vertical to lateral ratio of less than 0.8, wherein the trimming simultaneously forms a deposition over the organic mask, where the trimming the organic mask, comprises flowing a trimming gas into the plasma processing chamber, comprising a trimming component comprising $O_2$ and a deposition component comprising a silicon containing gas containing gas is at least one of $SiCl_4$, $SiF_4$, or $SiH_4$, forming the trimming gas into a plasma, and stopping the flow of the trimming gas into the plasma processing chamber. The memory stack is etched. The steps of trimming the organic mask and etching the memory stack is cyclically repeated a plurality of times in a single processing chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the formation of stair-step structures a trim and etch scheme is utilized. Basically, one stair will be etched first then a mask is trimmed to pull back the mask without affecting the substrate. Then another stair is etched, where the trim/etch process is cycled a plurality of times. One difficulty with such a scheme is that during the lateral trim of the mask, the height of the mask is also reduced. Such a reduction may be more than the lateral trim of the mask. Such a reduction places a limit on the number of steps that may be etched before requiring the formation of a new mask.

Figure 1:
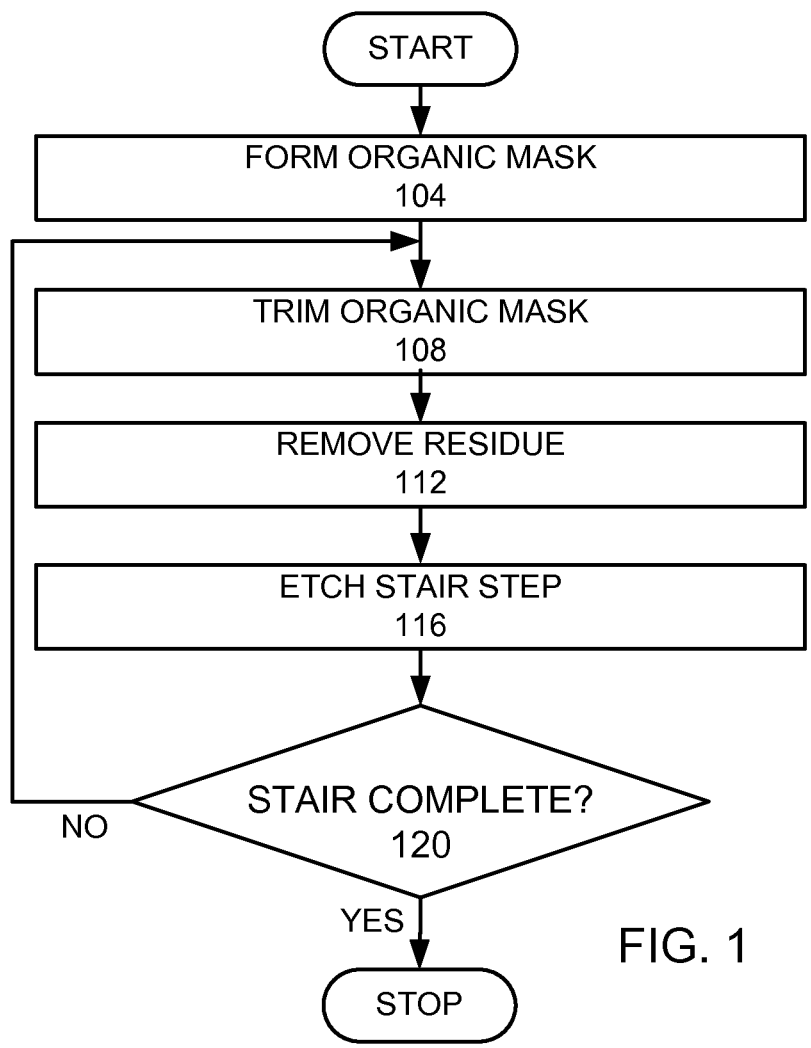
FIG. 1 is a high level flow chart of a process that may be used in an embodiment of the invention.

To facilitate understanding, FIG. 1 is a high level flow chart of a process that may be used in an embodiment of the invention, which forms a stair-step structure in a substrate. An organic mask is formed over a substrate (step 104). The organic mask is trimmed with a vertical to lateral ratio of less than 0.8, where the trimming simultaneously forms a deposition over the organic mask (step 108). Residue is removed (step 112). The substrate is then etched to form a step (step 116). Steps 108 to 116 are repeated until the stair-step structure is completed (step 120).

EXAMPLE

Figure 2A:
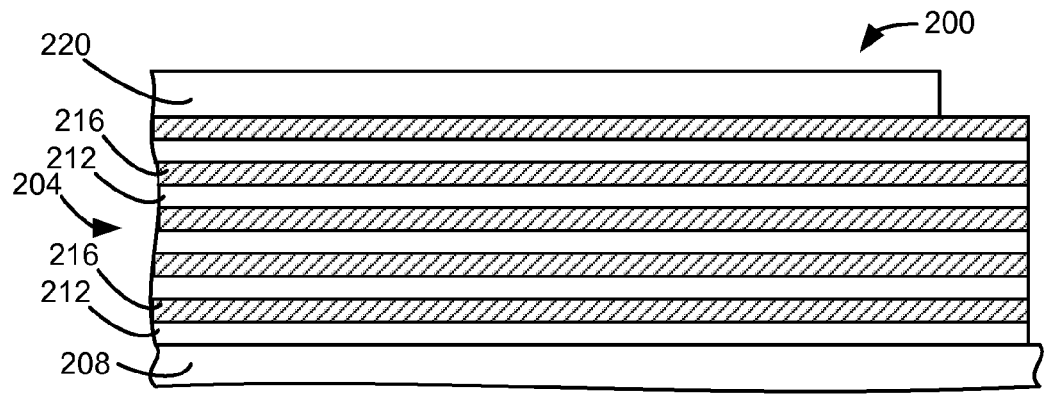
FIGS. 2A-L are schematic cross-sectional views of a memory stack formed according to an embodiment of the invention.

In an example of an implementation of the invention, a stair-step memory array is etched. In such a memory array, memory stacks are formed over a wafer. FIG. 2A is a cross sectional view of a plurality of layers of memory stacks 204 formed over a wafer 208. In this embodiment, each memory stack of the plurality of memory stacks are formed by bilayers of a layer of silicon oxide ($SiO_2$) 216 on top of a layer of silicon nitride 212. An organic mask 220 is formed over the memory stacks 204. The organic mask may be a photoresist mask that is formed using a spin on process and the photolithographic patterning. In the alternative, the organic mask may be a spun on or otherwise applied organic layer, without photolithographic patterning.

Figure 3:
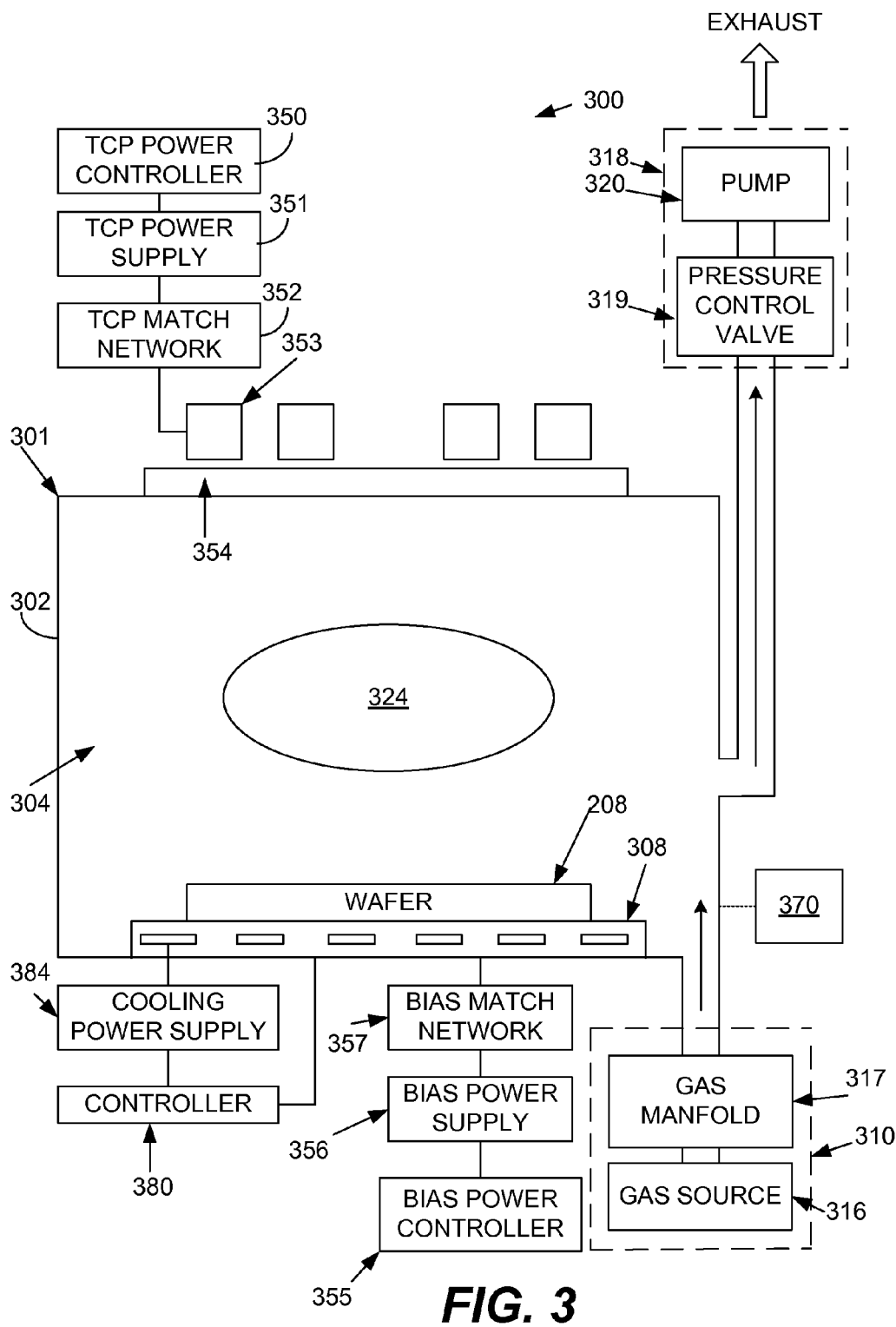
FIG. 3 is a schematic view of a plasma processing chamber that may be used in practicing the invention.

The wafer 208 may be placed in a processing tool to perform subsequent steps. FIG. 3 illustrates a processing tool that may be used in an implementation of the invention. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304, while allowing energy to pass from TCP coil 353 to plasma chamber 304.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a wafer 208, such as the semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of a cooling recirculation system provided within the chuck electrode 308 by controlling a cooling power supply 384. The plasma processing system also includes electronic control circuitry 370. The plasma processing system may also have an end point detector. An example of such an inductively coupled system is the Kiyo built by Lam Research Corporation of Fremont, Calif., which is used to etch silicon, silicon nitride, silicon oxide, and conductive layers, in addition to dielectric and organic materials. In other embodiments of the invention, a capacitively coupled system may be used.

Figure 4:
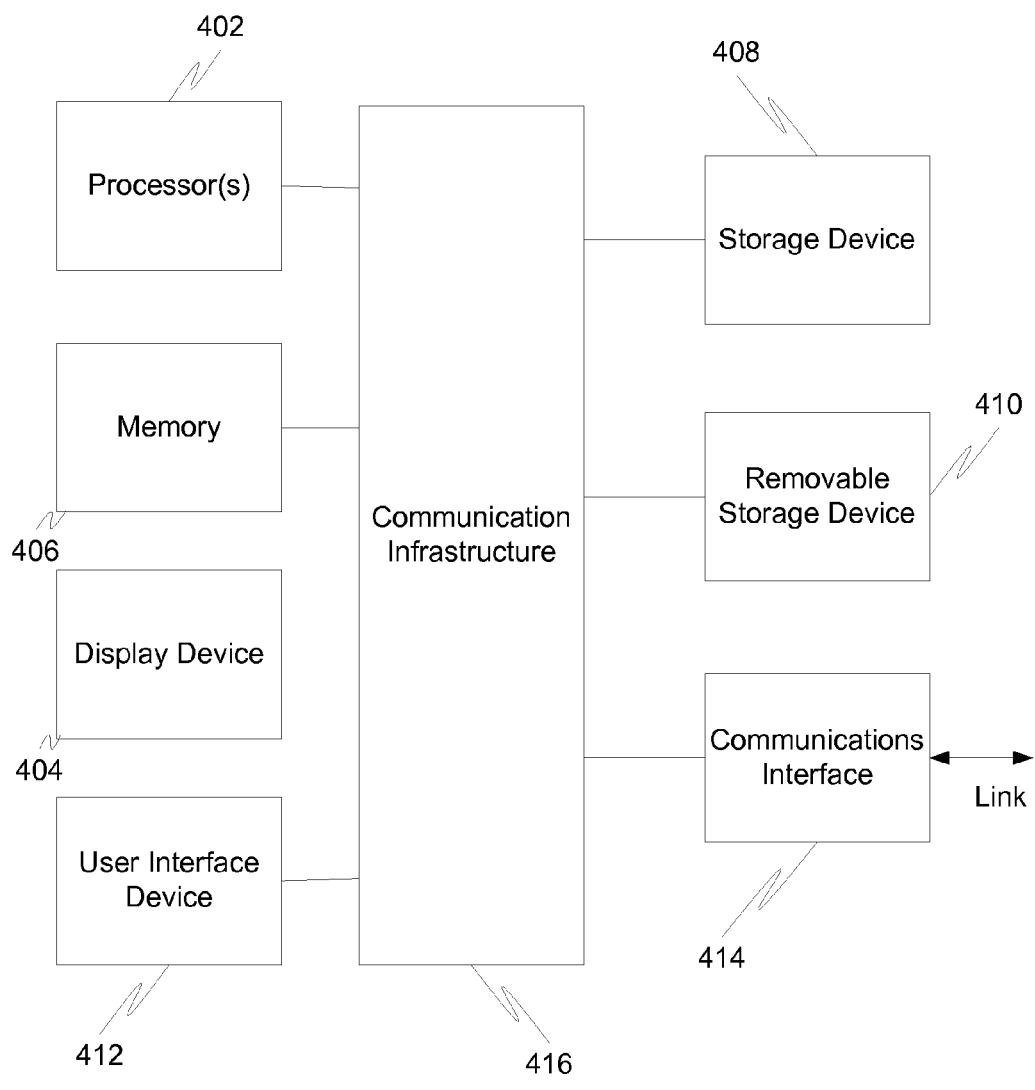
FIG. 4 illustrates a computer system, which is suitable for implementing a controller used in embodiments of the present invention.

FIG. 4 is a high level block diagram showing a computer system 400, which is suitable for implementing a control circuitry 370 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
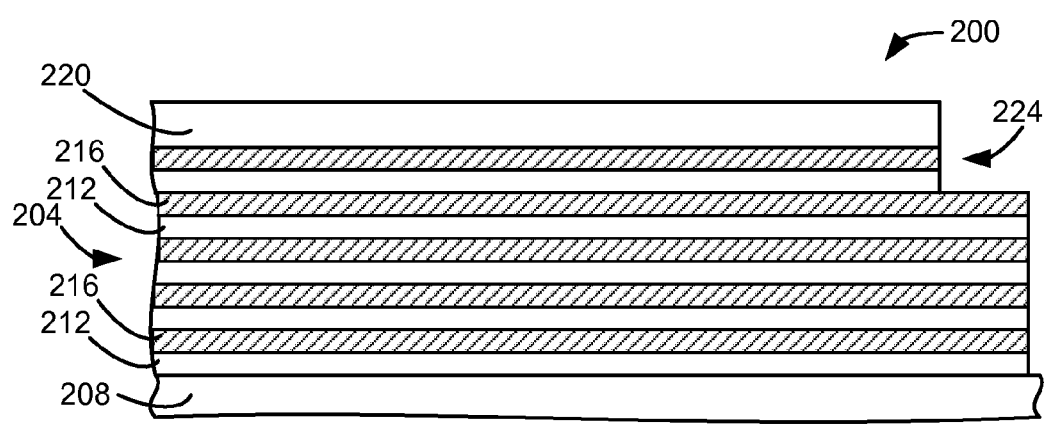
Figure 5:
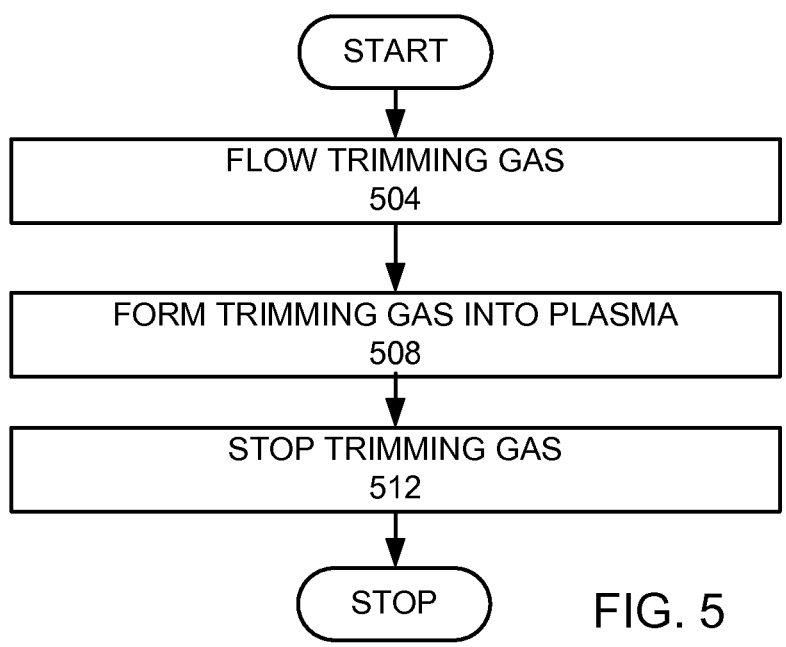
FIG. 5 is a more detailed flow chart of the step of trimming the organic mask.

In this example, a first stair-step etch is performed before the organic mask is trimmed, forming a stair-step 224, as shown in FIG. 2B. The organic mask is trimmed (step 108). FIG. 5 is a more detailed flow chart of the step of trimming the organic mask (step 108). A trimming gas is flowed from the gas source 316 into the plasma chamber 304 (step 504). The trimming gas comprises oxygen and a silicon containing gas. The trimming gas is formed into a plasma (step 508). After the organic mask 220 is sufficiently trimmed, the trimming gas is stopped (step 512).

An example of a recipe for the trim provides a pressure between 80 to 400 mTorr. A trim gas is flowed from the gas source 316 to the plasma chamber 304 (step 504), where the trimming gas is 700 sccm $O_2$, 40 sccm $SiCl_4$, and 40 sccm $NF_3$. The trimming gas is formed into a plasma (step 508). In this example, 1800 watts TCP power is provided at 13.56 MHz. 0 volts of bias is provided. The plasma is maintained for 20 to 60 seconds, and then the trimming gas is stopped (step 512).

Figure 2C:
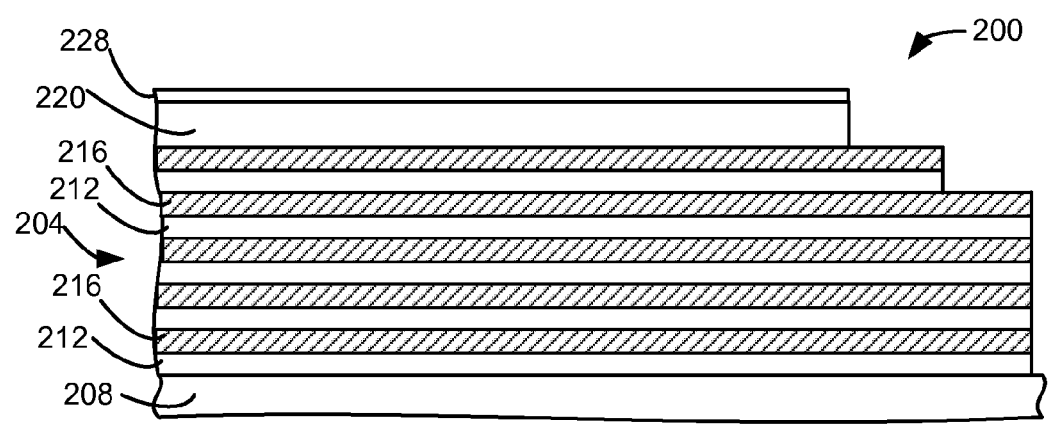

FIG. 2C is a cross-sectional view of the stack, after the organic mask 220 is trimmed. The addition of a silicon containing gas in the trimming gas causes a thin deposition layer 228 to form on top of the organic mask 220 during the trimming. The thin deposition layer 228 reduces the rate of the thinning of the organic mask 220, so that the ratio of the vertical etch of the organic mask to the lateral etch of the organic mask is less than 0.8, so that the sides of the organic mask 220 are trimmed faster than the reduction of the height of the organic mask 220. In some embodiments a deposition is formed over the sides of the organic mask 220, however the deposition on top of the organic mask 220 is thicker than the deposition on the sides of the organic mask 220. In addition, the deposition on the sides of the organic mask 220 is so thin that the $O_2$ plasma is able to trim the organic mask 220 through the thin side deposition at about the rate as if there was no deposition. After the organic mask is trimmed some or all of the deposition layer 228 remains as residue from the deposition layer.

Figure 2D:
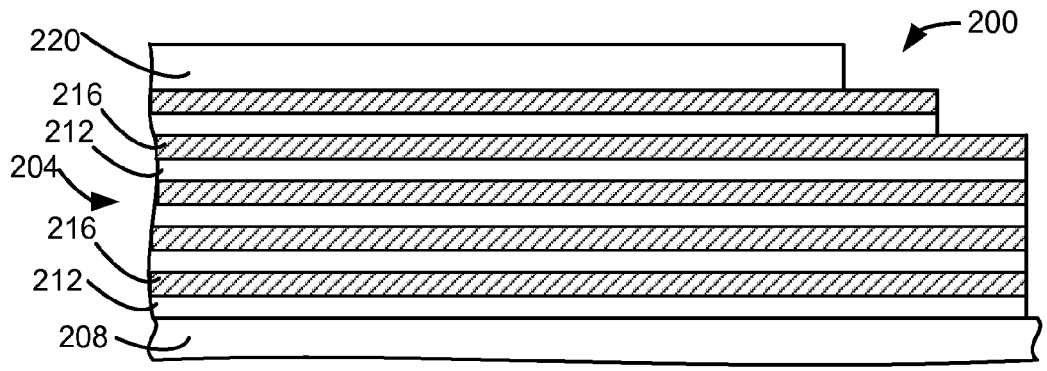

Residue from the deposition layer is removed (step 112). FIG. 2D is a cross-sectional view of the stack after residue from the deposition layer is removed. A recipe for the removing residue from the deposition layer provides a pressure of 20 mTorr. A flow of a residue removal gas of 200 sccm $NF_3$ is provided from a gas source. The RF power source provided 1000 watts of TCP power. 0 volts of bias is provided. The process is provided for 5~15 seconds. Other embodiments may use other recipes.

Figure 2E:

A stair-step is etched using the organic mask as a mask (step 116). FIG. 2E is a cross-sectional view of the stack after a stair-step has been etched, so that there is now a first stair-step 240 and a second stair-step 244. The first stair-step 240 is etched deeper during the etching of the second stair-step 244. A recipe for etching the silicon oxide sublayer 216 of the stair step provides a pressure of 10 mTorr. A flow of a etch gas of 40 sccm $O_2$, 300 sccm Ar, and 60 sccm $C_4F_6$ is provided from a gas source. The RF power source provided 1320 watts of TCP power. 500 volts of bias is provided. The process is provided for 10 seconds.

A recipe for etching the silicon nitride sublayer 212 of the stair step provides a pressure of 30 mTorr. A flow of a etch gas of 100 sccm $O_2$, 140 sccm $CH_3F$, and 60 sccm $C_4F_6$ is provided from a gas source. The RF power source provided 1800 watts of TCP power. 500 volts of bias is provided. The process is provided for 14 seconds.

In another embodiment, the residue from the deposition layer is removed simultaneously with the etch, instead of in a previous step. In such an embodiment, there is little etch selectivity between the deposition layer and that the memory stack 204, since it would be desirable to quickly etch away the deposition layer.

Preferably, the etch selectively etches the memory stack 204 with respect to the organic mask, so that minimal organic mask is etched away. An example of a recipe for etching the stair-step in a memory stack with a silicon oxide based layer used a $C_4F_6$ and $O_2$ based etch gas. Because many different substrates may be etched, many different chemistries may be used for the etch process.

Figure 2F:
Figure 2G:
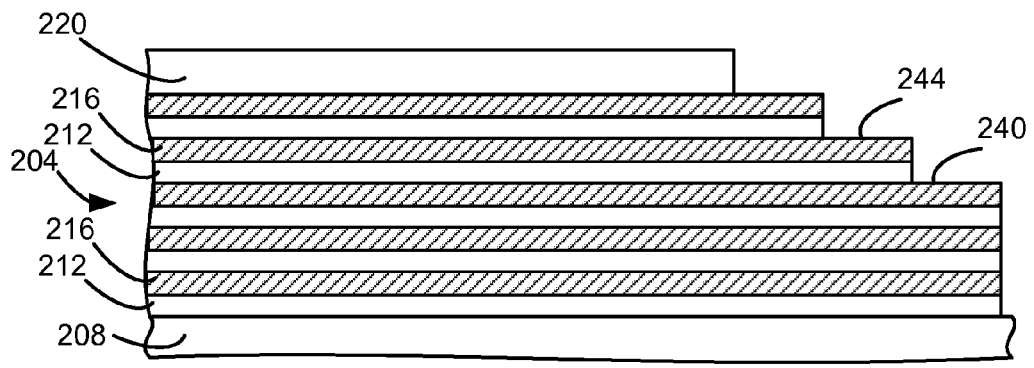
Figure 2H:
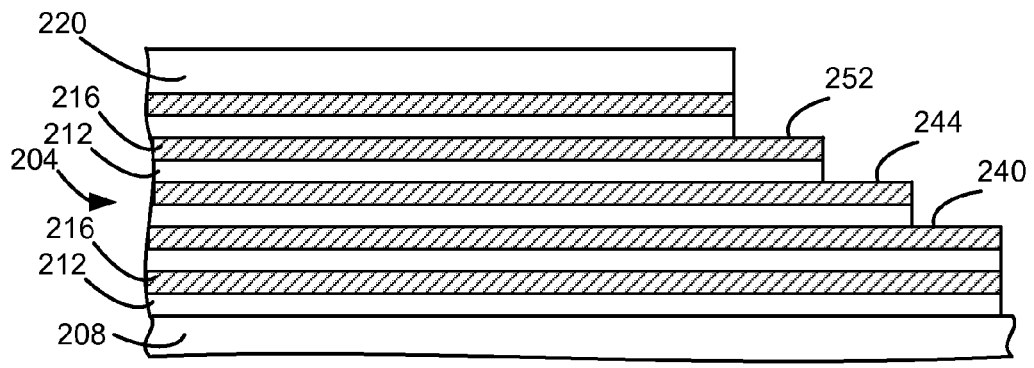

It is determined that additional stair-steps are needed (step 120), so the organic mask 220 is trimmed again (step 108). FIG. 2F is a cross-sectional view of the stack with a deposition layer 248 deposited over the organic mask 220, as the organic mask 220 is trimmed. Residue from the deposited layer is removed (step 112), as shown in FIG. 2G. The stair-steps are etched (step 116), as shown in FIG. 2H, forming an additional third step 252 in addition to further etching the first stair-step 240 and the second stair-step 244.

Figure 2I:
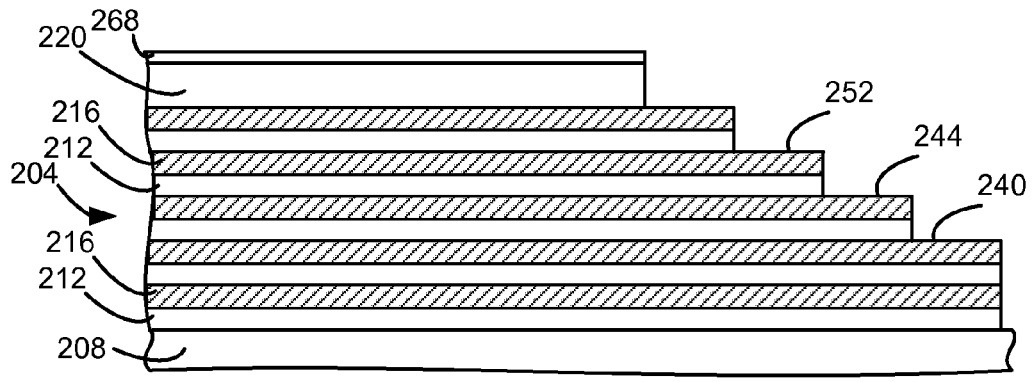
Figure 2J:
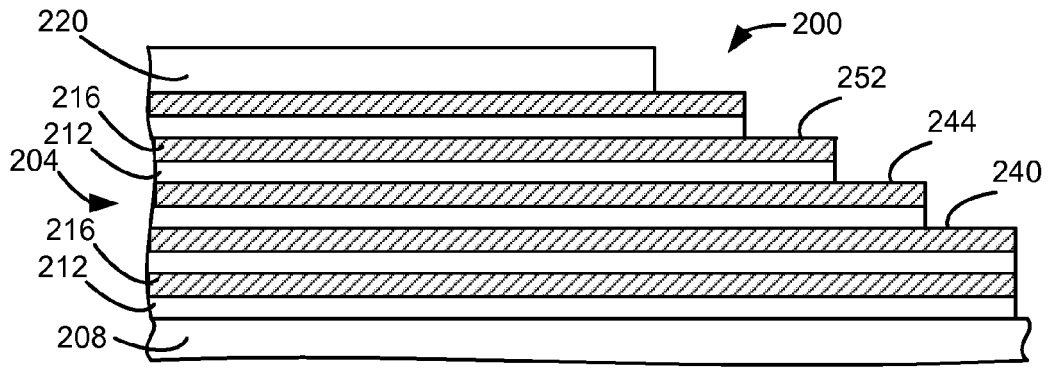
Figure 2K:
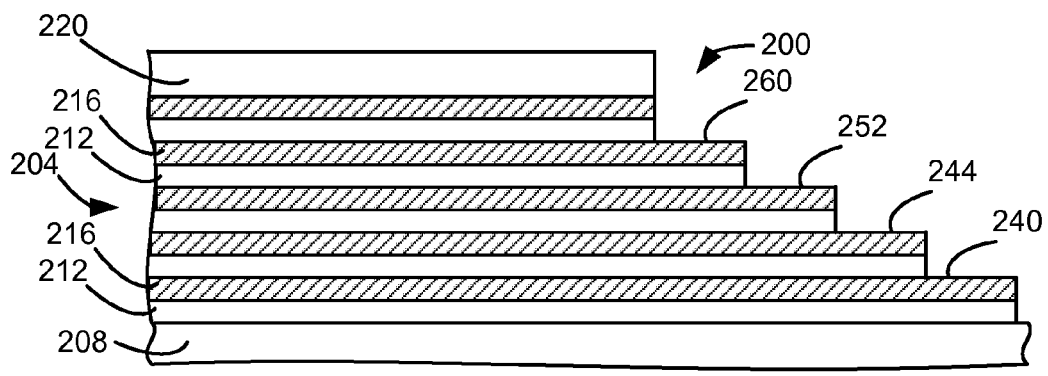

It is determined that additional stair-steps are needed (step 120), so the organic mask is trimmed again (step 108). FIG. 2I is a cross-sectional view of the stack with a deposition layer 268 deposited over the organic mask 220, as the organic mask 220 is trimmed. Residue from the deposited layer is removed (step 112), as shown in FIG. 2J. The stair-steps are etched (step 116), as shown in FIG. 2K, forming an additional third step 252 in addition to further etching the first stair-step 240 and the second stair-step 244.

Figure 2L:
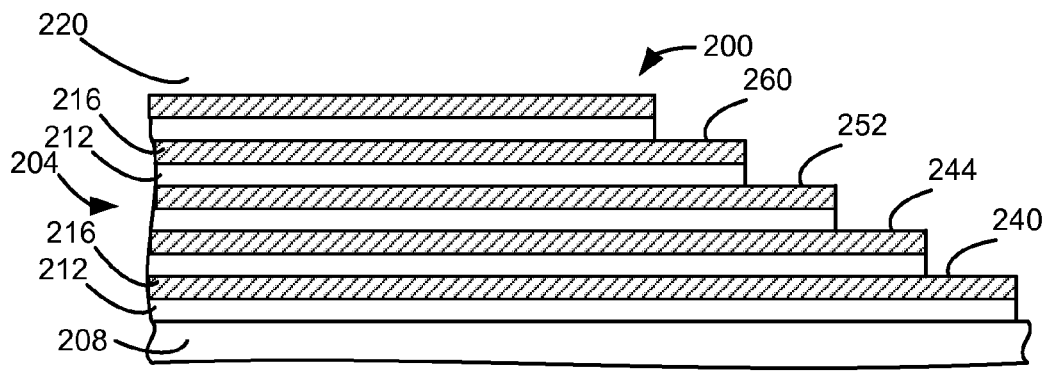

If no additional stair-steps are needed (step 120), the cyclical process is complete. Additional steps may be provided for further processing. For example, the organic mask 220 may be stripped, as shown in FIG. 2L, resulting in a memory stack with five stair-steps counting the top layer. The additional steps, such as stripping the organic mask may be done in the same chamber before removing the substrate from the chamber, or the substrate may be removed from the chamber to perform the additional steps. This embodiment allows the trimming the organic mask, the removing the residue, and the etching the substrate to be performed in the same chamber, so that the same plasma reactor, power supply, coil/electrode, and chuck electrode are used in all of the steps.

Because the process allows the organic mask to be trimmed with less thinning of the organic mask, a large number of stair-steps may be provided. Preferably, the cycle is repeated at least 3 times, so that at least five stair-steps are provided. More preferably, at least 8 stair-steps may be provided with a single organic mask forming process. More preferably, more than twenty stair-steps may be provided using a single organic mask process. The stair-steps may be formed in one or more directions in other embodiments. In one example, a stair-step structure was created with thirty-two steps.

In this embodiment, the thin deposited layer is silicon oxide formed from the silicon and oxygen components of the trimming gas. The trimming the organic mask has a vertical to lateral ratio of less than 0.8. More preferably, the trimming of the organic mask has a vertical to lateral ratio of less than 0.5. The deposited layer is selectively deposited on top of the organic mask with respect to the sidewalls of the organic mask, so that the deposited layer is thicker on top of the organic mask than on the sidewalls of the organic mask, which helps provide the vertical to lateral etch ratio of less than 0.8.

In other embodiments, the substrate may be made of other materials, to be etched, or the substrate may be a solid piece of a single material. In a preferred embodiment, the substrate comprises a plurality of layers where each layer comprises at least two sublayers used to form the memory stacks of the substrate. In one example, at least one sublayer is silicon nitride. In another example, each layer comprises three sublayers. In other embodiments, other trim gases may be used in addition to or in place of $O_2$. In other embodiments, the silicon containing gas comprises $SiF_4$, $SiH_4$, or $SiCl_4$. In other embodiments the trimming component may further comprise $NF_3$. In other embodiments a trim of the organic mask layer without simultaneously forming a deposition is also performed in a separate step. Such a trim would have a vertical to lateral ratio of greater than 0.8. Which means that the vertical etch rate divided by the lateral etch rate would be greater than 0.8.

The process in an embodiment of the invention also provides a faster process than a process that provides a hardmask over the organic mask layer. This is done by eliminating the hardmask formation step. This provides for a faster through put. In addition, since some of the deposited layer may be removed during the trimming, removal of deposition residue is much quicker than removal of a hardmask. The reduced organic thinning allows for either more steps to be etched with a given organic mask layer or a reduced organic mask thickness, which increases resolution.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming a stair-step structure in a substrate under an organic mask within a plasma processing chamber, comprising:
   a) trimming the organic mask with a vertical to lateral ratio of less than 0.8, wherein the trimming simultaneously forms a deposition over the organic mask, comprising:
      flowing a trimming gas into the plasma processing chamber, comprising a trimming component comprising $O_2$ and a deposition component comprising a silicon containing gas;

forming the trimming gas into a plasma; and
stopping the flow of the trimming gas into the plasma processing chamber;

b) removing deposition residue after trimming the organic mask and before etching the substrate;

c) etching the substrate; and d) repeating steps a through c a plurality of times.

2. The method, as recited in claim 1, wherein the silicon containing gas is at least one of $SiCl_4$, $SiF_4$, or $SiH_4$.

3. The method, as recited in claim 2, wherein the repeating steps a through c is repeated at least 3 times.

4. The method, as recited in claim 3, wherein steps a through c are performed in a single plasma processing chamber.

5. The method, as recited in claim 4, wherein the substrate comprises a plurality of layers, wherein each layer comprises at least two sublayers, wherein at least one of the at least two sublayers is silicon oxide.

6. The method, as recited in claim 4, wherein the substrate comprises a plurality of layers, wherein each layer comprises at least two sublayers wherein at least one layer of the at least two sublayers is silicon oxide and at least one layer of the at least two sublayers is silicon nitride or polysilicon.

7. The method, as recited in claim 4, wherein the etching the substrate removes deposition residue.

8. The method, as recited in claim 1, wherein the repeating steps a through c is repeated at least 3 times.

9. The method, as recited in claim 1, wherein steps a through c are performed in a single plasma processing chamber.

10. The method, as recited in claim 1, wherein the substrate comprises a plurality of layers, wherein each layer comprises at least two sublayers, wherein at least one of the at least two sublayers is silicon oxide.

11. The method, as recited in claim 1, wherein the substrate comprises a plurality of layers, wherein each layer comprises at least two sublayers wherein at least one layer of the at least two sublayers is silicon oxide and at least one layer of the at least two sublayers is silicon nitride or polysilicon.

12. The method, as recited in claim 1, wherein the etching the substrate removes deposition residue.

13. A method for making a three dimensional memory structure, comprising:

a) providing memory stack comprising a plurality of layers, wherein each layer comprises at least two sublayers;

b) forming an organic mask over the memory stack;

c) trimming the organic mask with a vertical to lateral ratio of less than 0.8, wherein the trimming simultaneously forms a deposition over the organic mask, wherein the trimming the organic mask, comprises:

flowing a trimming gas into the plasma processing chamber, comprising a trimming component comprising $O_2$ and a deposition component comprising a silicon containing gas containing gas is at least one of $SiCl_4$, $SiF_4$, or $SiH_4$;

forming the trimming gas into a plasma; and stopping the flow of the trimming gas into the plasma processing chamber;

d) removing deposition residue after trimming the organic mask and before etching the substrate;

e) etching the memory stack; and f repeating steps c and e a plurality of times in a single processing chamber.

14. The method, as recited in claim 13, wherein the etching the substrate removes deposition residue.

* * * * *